United States Patent [19]

Kump et al.

[11] Patent Number: 4,736,374

[45] Date of Patent: Apr. 5, 1988

[54] AUTOMATED TEST APPARATUS FOR USE WITH MULTIPLE EQUIPMENT

[75] Inventors: Donald Kump, Northport; Eddie T. Kovacs, Kings Park, both of N.Y.

[73] Assignee: Grumman Aerospace Corporation, Bethpage, N.Y.

[21] Appl. No.: 863,265

[22] Filed: May 14, 1986

[51] Int. Cl.[4] .................. G06F 11/22; G06F 11/00
[52] U.S. Cl. .................................. 371/20; 371/25; 371/29; 324/73 R
[58] Field of Search .................. 371/15, 16, 18, 20, 371/25, 29; 324/73 R, 73 AT; 364/200, 900

[56] References Cited

U.S. PATENT DOCUMENTS

| | | | |
|---|---|---|---|
| 3,854,125 | 10/1974 | Ehling et al. | 364/200 |
| 4,053,752 | 10/1978 | DeJohn et al. | 364/200 |
| 4,066,882 | 1/1978 | Esposito | 324/73 R |
| 4,108,358 | 8/1978 | Niemaszyk et al. | 324/73 R |
| 4,211,917 | 7/1980 | Hofmann | 371/20 |
| 4,315,311 | 2/1982 | Causse | 371/18 |
| 4,393,498 | 7/1983 | Jackson | 371/20 |
| 4,489,414 | 12/1984 | Titherley | 371/20 |
| 4,554,630 | 11/1985 | Sargent | 364/200 |
| 4,617,663 | 10/1986 | Lake | 371/20 |
| 4,622,647 | 11/1986 | Sagnard | 371/20 |
| 4,625,313 | 11/1986 | Springer | 371/16 |
| 4,635,218 | 1/1987 | Widdoes | 371/20 |
| 4,637,020 | 1/1987 | Schinabeck | 371/20 |
| 4,638,455 | 1/1987 | Yamazaki | 371/20 |
| 4,656,632 | 4/1987 | Jackson | 371/25 |

OTHER PUBLICATIONS

Waddell et al., "Enhanced Error Recovery in a Virtually Addressed System Employing Implied Reserve of Real Units," IBM Technical Disclosure Bulletin, vol. 18, No. 2, Jul. 1975, pp. 314-315.

*Primary Examiner*—Michael R. Fleming
*Attorney, Agent, or Firm*—Pollock, VandeSande & Priddy

[57] ABSTRACT

A number of standardized microprocessors are used as building blocks for gaining access and control to other standardized functional resource circuit units. One of the microprocessors is selected by a main processing unit to capture the different functional resource circuit units needed to perform functions of a discrete test instrument. To instruct the different resource circuit units to perform the needed functions, a program is downloaded from a mass memory by the microprocessor. After having performed the necessary functions, the microprocessor releases the different functional resource circuit units, which—along with the microprocessor—would return to idle and await the next selection.

11 Claims, 3 Drawing Sheets

AUTOMATED TEST APPARATUS FOR USE WITH MULTIPLE EQUIPMENT

FIELD OF THE INVENTION

The present invention relates to automatic testing equipment (ATE), and more particularly to an ATE which uses functional block circuits instead of discrete instruments for testing an equipment under test.

DESCRIPTION OF THE RELATED ART

The conventional method of testing an equipment—for example, an aiming device for an avionic weapon system—is to connect the device to any one of a number of discrete test instruments through an interface of the ATE. Because each of the instruments performs a unique test, invariably each of the instruments is built by a manufacturer who is only interested in that particular instrument. And since there may be a myriad number of equipment in an advanced aircraft which need to be tested, an ATE, in order to be able to test all of these equipment, has to include a large number of different test instruments. Further, because redundancy is desired for an ATE, there usually exists multiple number of the same test instrument.

SUMMARY OF THE INVENTION

The present invention eliminates the need of an ATE to have a multiple number of the same test instrument by using standardized building block circuits and processing units for performing the same functions that a discrete test instrument performs. In lieu of the many discrete test instruments in an ATE, the present invention uses a set number of standardized function block circuits and processor means for performing tests on all of the equipment which need to be tested.

Therefore, it is an object of the present invention to provide an ATE which is capable of testing all of the equipment under test without having to resort to different discrete test instruments.

It is an additional object of the present invention to provide an ATE which does not need redundant discrete test instruments as back-ups.

It is yet a further object of the present invention to provide an ATE which is more reliable and costs less than the conventional ATE.

The above-mentioned objects and advantages of the present invention will become more apparent and the invention itself will be best understood by reference to the following description of an embodiment of the invention taken in conjunction with the accompanying drawings, wherein:

DESCRIPTION OF THE PREFERRED EMBODIMENT

There are many types of different test instruments in a conventional ATE. Each of these test instruments is built by a manufacturer who does not know (or care) how the other instruments were built. But what every one of the conventional test instruments of an ATE does have is a microprocessor. Further, each of the test instruments is made up of well-known standardized circuitries. Of course, these circuitries are put together in such a way that a specific function is performed by a particular test instrument. For example, a Flute digital voltmeter may have an Intel microprocessor while a Techtronics oscilloscope may have a Motorola microprocessor. However, the fact remains that each one of these test instruments is comprised of standard functional circuits such as a sample-and-hold network, a digital-to-analog converter, memories, etc. Thus, were 15 tests required to be performed on an equipment, then 15 different microprocessors (assuming microprocessors are used) of 15 distinct test instruments are required to be implemented in 15 different ways with discrete functional circuits. Since most of the test instruments for a conventional ATE are custom made, the customer, in turn, has to maintain an inventory of spare parts for these test instruments, albeit the circuitries in the different test instruments are functionally similar.

Figure 1:
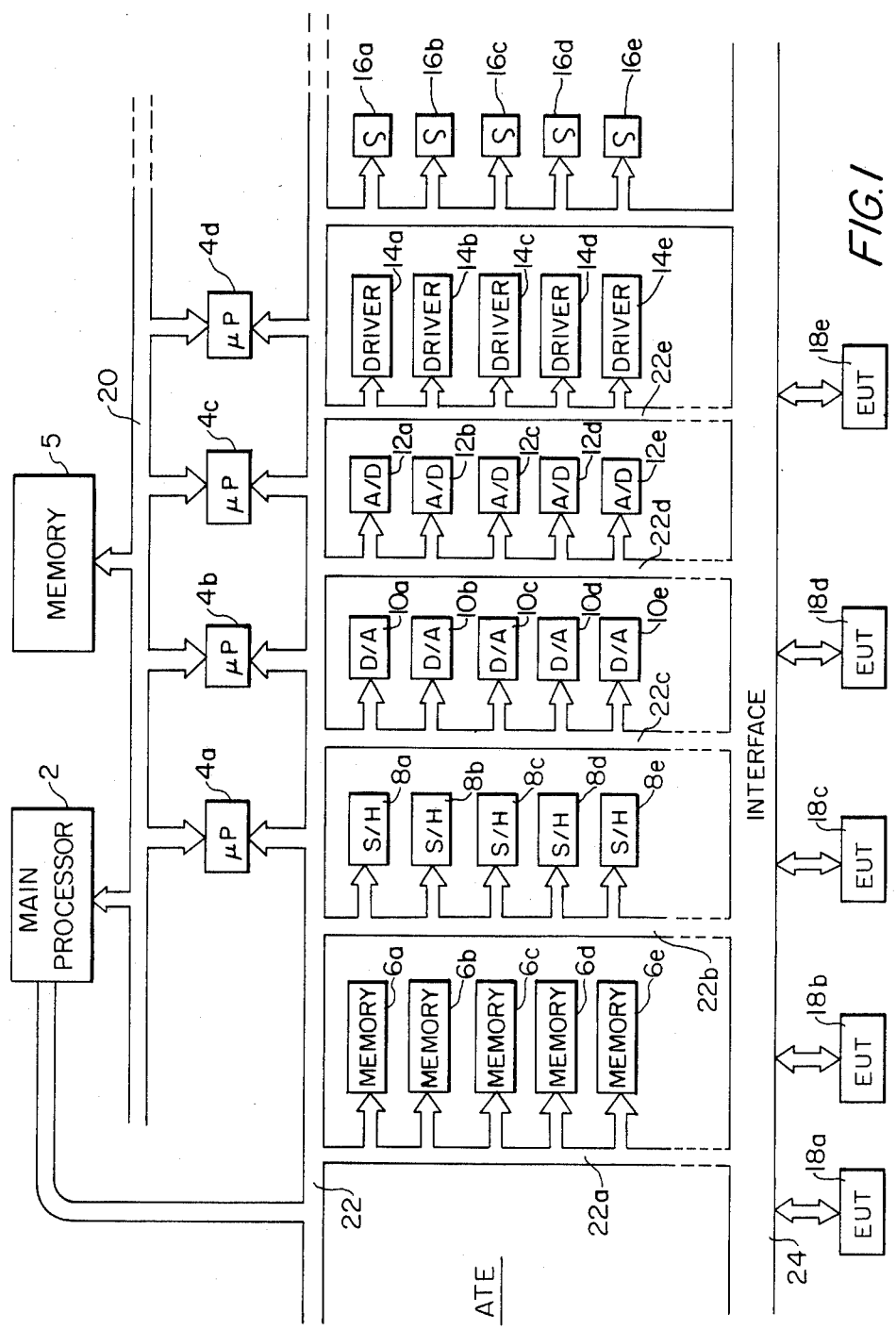
FIG. 1 is a block diagram showing the connection between the different components of the present ATE.

Referring to the figures, and more particularly to FIG. 1, the essential components of the present invention are illustrated. It should be noted that the configuration as illustrated in FIG. 1 is not meant to be all encompassing, as additional components and/or processing means can be added thereto. As shown in FIG. 1, the present invention ATE comprises a main processor 2, a number of microprocessors 4a–4d, a memory 5 and a number of functional resource units, labeled 6a–6e to 16a–16e. It is to be emphasized that the number of microprocessors, the functional resource units and the memory are not to be limited to those shown in FIG. 1. For example, the number of microprocessors may increase or decrease, depending on the requirements of the ATE for a particular customer. The same is true for the functional resource units. As for the memory, it is to be noted that memory 5 may be comprised of ROMs and RAMs as well as tapes and discs.

As shown, main processor 2 is connected to both memory 5 and microprocessors 4a–4d via a bus line 20. In order to facilitate the large amount of data which traverses between processor 2 and the microprocessors, a conventional high-speed interprocessor bus such as the Ethernet is used. Each of the microprocessors in turn is connected via a bus 22 to the various functional resource units. Bus 22 may be the so-called VME, which is a 32 bit bus line originated with Motorola, or the conventional Multibus 1 or 2, which originated with Intel. Although five sets of functional resource units are shown, it should be remembered that a larger or smaller number of sets may also be viable. It should also be noted that the six types of functional resource units shown are for illustration purposes only and that in the actual ATE system, there are many more diverse functional resource units. In this example, the functional resource units in each set are identical to those of the same set. For example, the sample-and-hold circuit S/H 8a is the same as S/H 8b to 8e. The functional resource units of each respective set are connected through corresponding bus lines 22a to 22e to interface 24, which may be a standard IEEE 488 interface. Any equipment under test, for instance 18a to 18e, is connected to the ATE through interface 24.

Keeping in mind that, in a typical ATE system, although there are a number of functional resource units—each of which is required to perform a different test at a different time to different equipment under test—rarely is there a need for more than two or three of these functional resource circuits at any one given time. Realizing that the idle functional resource circuit units can be more efficiently used, the present invention operates in the following manner. When an equipment under test, for instance 18a, is connected to interface 24, a signal is sent to main processor 2. This signal informs main processor 2 that, in order to test equipment 18a, an arbitrary function generator, for example, is needed. At this stage, main processor 2 interrogates microprocessors 4a to 4d, or whatever number of microprocessors there are, in order to find a microprocessor which is idle and thus is available. In this example, assume microprocessor 4b is idle. Main processor 2 then informs microprocessor 4b that the microprocessor is to become an arbitrary function generator. Upon receiving this information, microprocessor 4b then retrieves data from memory 5, or other standby memory (not shown), which would indicate to it the types of function which an arbitrary function generator are to perform. With this information, microprocessor 4b is able to capture from among the different sets of functional resource units the idle resource units which are available at that time.

Assuming that an arbitrary function generator requires a memory, a sample-and-hold circuit, a digital-to-analog converter circuit, an analog-to-digital converter circuit, a driver and an integrator, microprocessor 4b would proceed to pick out from the different sets of functional resource units the available functional resource circuits. For example, memory 6a, S/H 8c, D/A 10b, A/D 12e, driver 14a and integrator 16c may be picked. After having synthesized an arbitrary function generator from the appropriate functional circuitries, microprocessor 4b then downloads from memory 5 a program which would allow the microprocessor to work in conjunction with the various functional resource circuits such that insofar as the equipment under test 18a is concerned, an actual arbitrary function generator is being used. At this point, it should be noted that instead of having to separately retrieve from memory 5 the circuitries and the instructions needed to perform the functions of an arbitrary function generator, the information pertaining to both the hardware and the software can be downloaded from a mass memory at the same time. As for the programs which are needed to execute the hardware, sample flow diagrams representative of the signal analyzer functions of an arbitrary function generator are submitted herewith as Appendix A, covering pages A1–A33. Once the arbitrary function generator test is completed and is so sensed by main processor 2, a message is sent from main processor 2 to microprocessor 48, informing the latter that an arbitrary function generator no longer is required. At this point, microprocessor 4b releases the various functional resource circuits and goes into idle.

Supposing that, instead of one, a multiple number of test instruments is needed to test an equipment. The present ATE would use the appropriate number of microprocessors for effecting the different types of test instruments needed to test the equipment. And as was mentioned previously, the number of functional resource units can be expanded and contracted upon demand or lack thereof. Consequently, the present ATE has the capability of performing a plurality of tests on a real-time basis with less test instruments than are needed in conventional ATEs. Furthermore, because there are a number of identical microprocessors and functional reference circuits, the present invention ATE provides for a measure of redundancy and safety which, for the conventional ATEs, would have required many more discrete spare parts. It should also be noted that, instead of having an isolated main processor 2, any one of microprocessors 4a–4d may be used as a main processor. Thus, the present invention ATE provides redundancies and capabilities at a cost which is much lower than that of the conventional ATEs.

Figure 2:
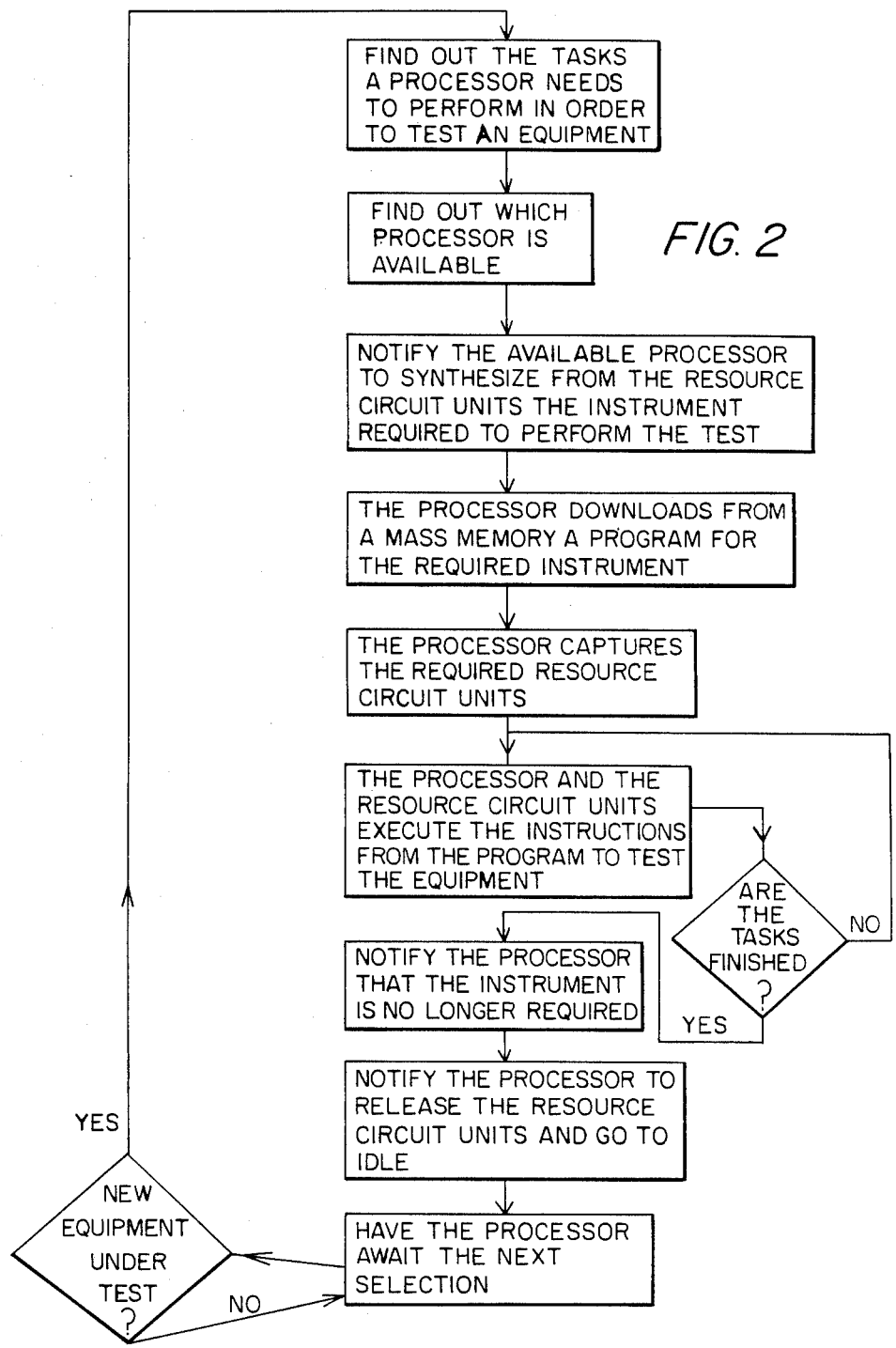
FIG. 2 is a flow chart which describes the sequence of operation of the present invention ATE.

FIG. 2 is a flow chart illustrating the steps which the present invention ATE uses to perform as a virtual instrument whereby virtually all of the functions required of a real instrument can be performed by a limited number of components.

Figure 3:
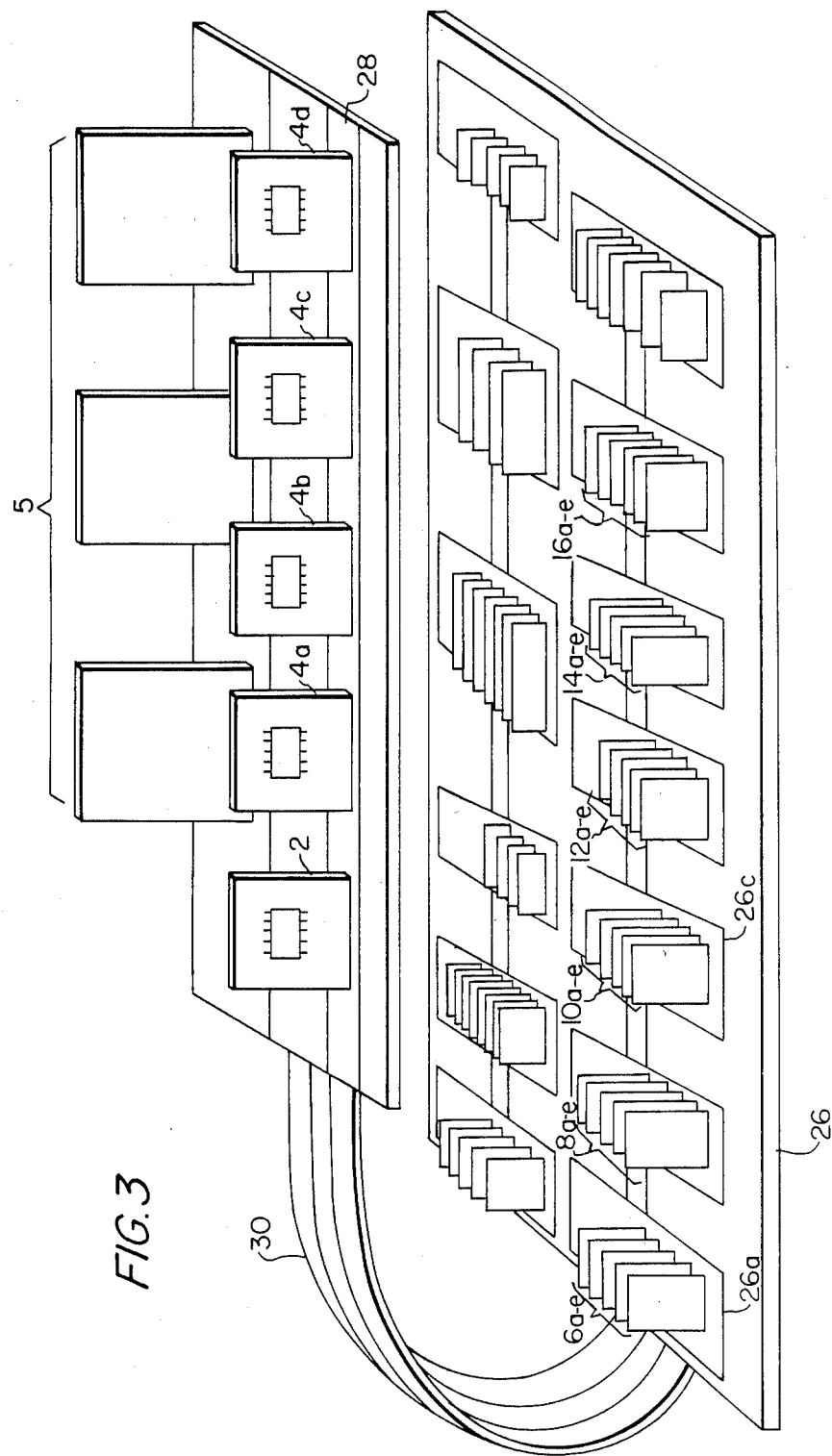
FIG. 3 is a schematic perspective view of the different function block circuits and processors of the present ATE.

FIG. 3 shows the components of the present invention, represented by circuit cards, positioned on modules 26 and 28. The cards representing the same components of FIG. 1 are similarly numbered. As shown, resource units performing the same functions are grouped into submodules. For instance, memories 6a–6e are grouped into submodule 26a while D-A circuits 10a–10e are grouped into submodule 26c. It should be appreciated that the number of cards, i.e. functional resource circuit units, can be increased or decreased in each of the submodules. It should also be noted that the different submodules can be of different sizes and different dimensions as cards performing different functions having different sizes may be needed. Module 26 is connected by cable 30 to module 28, with cable 30 being easily replaced by bus line 22.

On module 28 are microprocessors 4a–4d, main processor 2 and memory 5, which comprises, in this instance, three cards of IC memories. For the sake of clarity, interface 24, the equipment under test and the inputs and outputs of the ATE have been omitted in FIG. 3, which is meant to illustrate only a perspective view of the components of the present invention. Of course, more modules similar to module 26 are to be expected in the present invention ATE, as a large number of functional resource circuits are needed to cover the many tests expected to be performed on the different types of equipment under test.

While a preferred embodiment of the invention is disclosed herein for purposes of explanation, numerous changes, modifications, variations, substitutions and equivalents, in whole or in part, will now be apparent to those skilled in the art to which the invention pertains. Accordingly, it is intended that the invention be limited only by spirit and scope of the appended claims.

We claim:

1. A system for testing different types of equipment under test, comprising:
   means for interfacing an equipment under test to the system;
   a plurality of functional resource sets;
   first bus means connecting the plurality of functional resource sets;
   a plurality of identical instrument controllers connected to the first bus means, each instrument controller capable of synthesizing from the plurality of functional resource sets different function instruments, each of the function instruments being adaptable to test a particular equipment under test;
   second bus means connecting the plurality of instrument controllers for effecting a communication link therebetween; and a central processing means connected to the second bus means for communicating with the instrument controllers, wherein, when an equipment under test is engaged to the system via the interfacing means, the processing means selects one instrument controller from the plurality of instrument controllers and instructs the selected controller of the particular equipment to be tested, the selected controller downloading instruments from a storage means for effecting the synthesizing of a function instrument from the functional resource sets, the function instrument being used for testing the particular equipment.

2. A system according to claim 1, wherein the storage means is connected to the second bus means, the storage means including instructions to be utilized by the instrument controllers to synthesize different function instruments from the different functional resource sets.

3. A system according to claim 2, wherein the storage means further includes instructions to be utilized by the selected instrument controller to operate the synthesized function instrument.

4. A system according to claim 3, wherein the storage means further comprises an index table for indicating to the processing means the availability of the different instrument controllers.

5. A system according to claim 4, wherein the processing means comprises a microprocessor.

6. A system according to claim 4, wherein each instrument controller comprises a microprocessor.

7. A system according to claim 1, wherein each resource set comprises a multiple number of identical functional resource circuit units.

8. A system according to claim 7, wherein each functional instrument is made from a different combination of functional resource circuit units picked from different functional resource sets.

9. A system for testing different types of equipment under test, comprising:
a plurality of functional resource sets each having a multiple number of identical resource circuit units;
first bus means connecting the resource circuit units;
a plurality of identical instrument controllers connected to the first bus means, each instrument controller capable of synthesizing from the plurality of resource units different function instruments, each function instrument being adaptable to test a particular equipment under test;
second bus means connecting the plurality of instrument controllers for effecting communication link therebetween;
a memory means connected to the second bus means and in communication with the instrument controllers;
a central processing means connected to the second bus means, the processing means selecting one instrument controller from the plurality of instrument controllers, the processing means further instructing the selected instrument controller to download from the memory means instructions for synthesizing a function instrument from the resource units and for operating the function instrument.

10. The method according to claim 9, further comprising:
notifying the instrument controller that the function instrument is no longer required; and
prompting the instrument controller to release the resource circuit units used for testing the equipment.

11. In a system for testing different equipment under test, the system including a plurality of function resource circuit units, a first bus connecting the resource circuit units to a plurality of instrument controllers, and a second bus connecting the instrument controllers to a central processing means and a memory means, a method of testing an equipment comprising:
connecting an equipment under test to the system via an interfacing means;
selecting from the plurality of instrument controllers an idle instrument controller;
instructing the selected idle instrument controller to synthesize a function instrument to test the connected equipment; wherein the synthesizing of the function instrument by the instrument controller includes:
downloading from the memory means respective programs for capturing the required resource units and performing test functions of the function instrument;
capturing the resource units required by the function instrument; and
executing the program for effecting the resource circuit units to test the equipment.

* * * * *